United States Patent [19]

Drake et al.

[11] 4,038,430
[45] July 26, 1977

[54] PROTECTION OF GLASS FROM AQUEOUS ATTACK

[75] Inventors: Cyril Francis Drake, Harlow; Robert Walter James Amos, New Barnet, both of England

[73] Assignee: ITT Industries, Inc., New York, N.Y.

[21] Appl. No.: 563,025

[22] Filed: Mar. 28, 1975

[51] Int. Cl.$^2$ .............................................. B05D 3/04
[52] U.S. Cl. .................................. 427/248 E; 427/82; 427/96; 427/337; 427/377
[58] Field of Search .................... 65/30; 427/255, 166, 427/96, 82, 333, 377, 248

[56] References Cited

U.S. PATENT DOCUMENTS

| | | | |
|---|---|---|---|
| 3,434,817 | 3/1969 | Hazdra et al. | 65/30 X |
| 3,849,181 | 11/1974 | Green | 427/255 |

*Primary Examiner*—Bernard D. Pianalto
*Attorney, Agent, or Firm*—John T. O'Halloran; Peter C. Van Der Sluys; Richard A. Menelly

[57] ABSTRACT

Low melting point glasses using $B_2O_3$ or $P_2O_5$ encapsulation materials are provided with protection against corrosion by heating in an atmosphere containing $P_2O_5$ or $B_2O_3$ respectively. A thin surface film of glass containing both boron and phosphorus oxides is formed.

3 Claims, No Drawings

PROTECTION OF GLASS FROM AQUEOUS ATTACK

This invention relates to a method of protecting glass from aqueous attack, and to glass produced by the method.

Low melting point glasses based on oxides of the elements of Group IIIB or VB of the Periodic Table find application as encapsulating materials, e.g. for semiconductor devices and electronic circuits. However, such glasses are soluble in water or dilute acids and are readily corroded by atmospheric moisture. Modification of the composition of the glass to minimise this effect changes the thermal expansion of the glass or raises its softening temperature.

According to the present invention there is provided a method of protecting glass based on an oxide of an element of Group IIIB or VB of the Periodic Table in which the glass has formed thereon a surface layer composed of a glass having approximately equimolecular amounts of the oxides of both an element of Group IIIB and an element of Group VB of the Periodic Table.

In a preferred embodiment of the invention a glass based on an oxide of an element from either Group IIIB or Group VB is heated in a gaseous atmosphere containing the oxide of an element from the other group.

For example, a lead borate glass, $PbO/B_2O_3$, is heated to 300° C in a stream of oxygen containing phosphorus pentoxide, $P_2O_5$, from a source of $P_2O_5$ at 270° C. The phosphorus oxide diffuses into the surface of the lead borate glass and forms a thin film, say approximately 1 micron in thickness, of glass containing both boron and phosphorus oxides. Such a thin film, although having different physical properties to those of the basic lead borate glass, will not affect the bulk properties of the basic glass. This film will be insoluble in aqueous solvents.

In a second example, a lead phosphate glass, $PbO/P_2O_5$, is heated in an atmosphere containing $B_2O_3$. Again a thin surface film of glass containing both boron and phosphorus is formed.

It is to be understood that the foregoing description of specific examples of this invention is made by way of example only and is not to be considered as a limitation on its scope.

We claim:

1. A method of encapsulating a substrate in glass comprising the steps of:
    applying a coating of lead borate glass onto a substrate;
    introducing a stream of oxygen containing phosphorus pentoxide to the coated substrate; and
    heating the coated substrate in the phosphorus pentoxide-containing oxygen stream to form a layer containing both boron and phosphate oxides on said lead borate glass.

2. A method of encapsulating a substrate in glass comprising the steps of:
    applying a coating of lead phosphate glass onto a substrate;
    introducing a stream of oxygen containing boron trioxide to the coated substrate; and
    heating the coated substrate to form a layer of glass containing both boron and phosphorus oxides on the lead phosphate glass.

3. The method of claim 2 wherein the substrate is heated to at least 300° C.

* * * * *